United States Patent
Hyde

(10) Patent No.: US 6,977,527 B1
(45) Date of Patent: Dec. 20, 2005

(54) METHOD AND APPARATUS FOR SUPPRESSING SPURIOUS VALUES IN A DIFFERENTIAL OUTPUT CURRENT

(75) Inventor: John D. Hyde, Corvallis, OR (US)

(73) Assignee: Impinj, Inc., Seattle, WA (US)

( * ) Notice: Subject to any disclaimer, the term of this patent is extended or adjusted under 35 U.S.C. 154(b) by 88 days.

(21) Appl. No.: 10/455,261

(22) Filed: Jun. 4, 2003

Related U.S. Application Data

(60) Provisional application No. 60/388,782, filed on Jun. 13, 2002.

(51) Int. Cl.[7] .................. H03K 19/0175; H03K 19/094
(52) U.S. Cl. .......................... 326/88; 326/93; 327/390; 327/379; 327/387
(58) Field of Search .............................. 326/27, 88, 95, 326/98, 113; 327/390, 379, 387; 341/155

(56) References Cited

U.S. PATENT DOCUMENTS

| | | | |
|---|---|---|---|
| 5,463,348 A | 10/1995 | Sarpeshkar et al. | |
| 6,166,978 A | 12/2000 | Goto | |
| 6,573,853 B1 * | 6/2003 | Mulder | 341/155 |
| 2004/0004861 A1 | 1/2004 | Srinivas et al. | |
| 2004/0037127 A1 | 2/2004 | Lindhorst et al. | |

OTHER PUBLICATIONS

Carley, L. Richard, "Trimming Analog Circuits Using Floating-Gate Analog MOS Memory", IEEE Journal of Solid-State Circuits, vol. 24, No. 6, Dec. 1989, pp. 1569-1575.
Mead, "Differentiators", Analog VLSI and Neural Systems, Chapter 10, 1989, pp. 163-178; no mo.

* cited by examiner

Primary Examiner—Daniel Chang
(74) Attorney, Agent, or Firm—Thelen Reid & Priest LLP; David B. Ritchie

(57) ABSTRACT

Methods and apparatus provide for front-end processing of a first differential output current, whereby a first differential output current is received and a second differential output current having reduced spurious content is produced. Current steering is used to divide, and reassemble, the first differential output current so as to provide an output signal with reduced spurious content. Current steering is implemented by a return-to-zero circuit that is coupled to the terminals of a first differential current output stage. During a first phase, the return-to-zero circuit provides a differential output current equal to the first differential current output. During a second phase, the return-to-zero circuit provides a differential output current equal to zero. The current steering return-to-zero circuit is implemented with MOSFETs or any other suitable electrical circuit element that provides the ability to controllably pass or refrain from passing current.

29 Claims, 2 Drawing Sheets

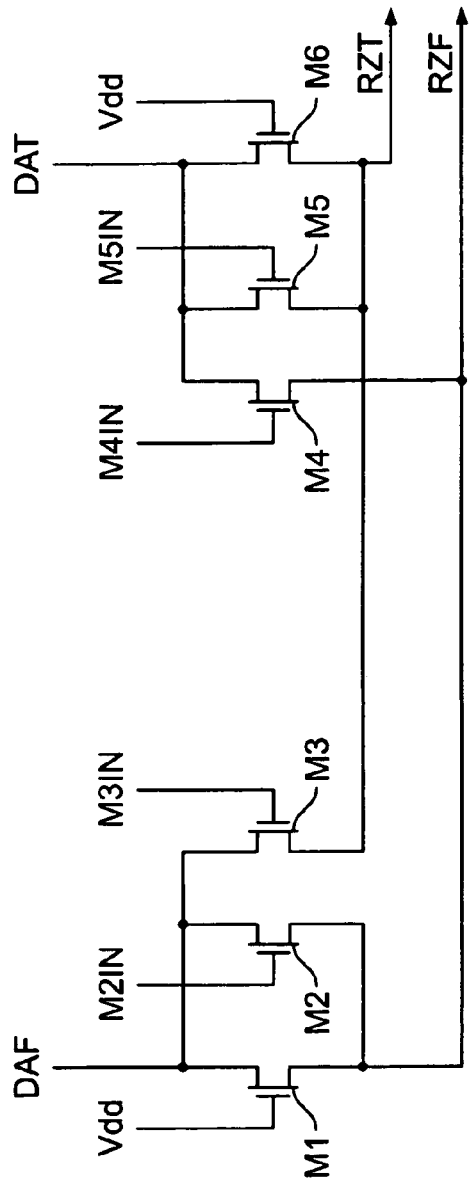
FIG. 2
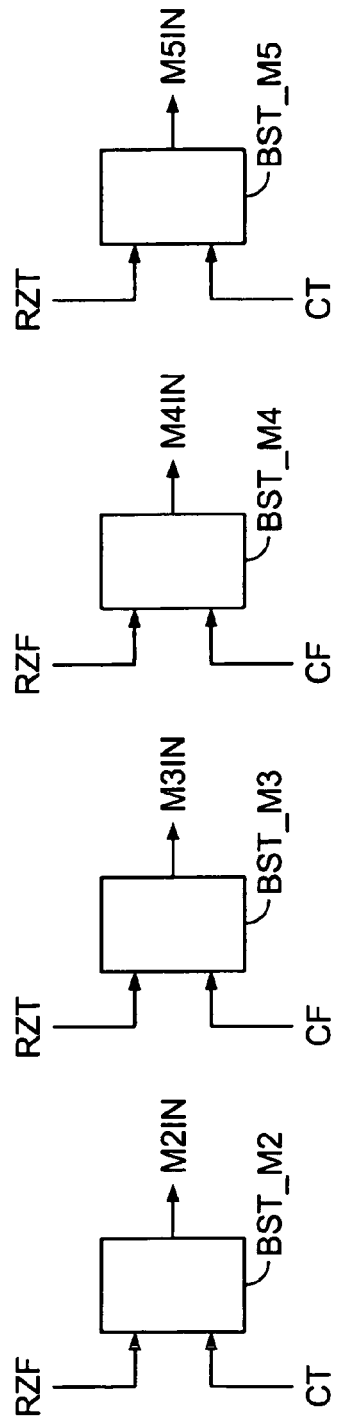
FIG. 3A
FIG. 3B
FIG. 3C
FIG. 3D

METHOD AND APPARATUS FOR SUPPRESSING SPURIOUS VALUES IN A DIFFERENTIAL OUTPUT CURRENT

CROSS REFERENCE TO RELATED APPLICATION

This application claims the benefit of U.S. provisional application No. 60/388,782, filed Jun. 13, 2002.

FIELD OF THE INVENTION

The methods and apparatus of the present invention relate generally to electronic circuits, and more particularly to circuits and operations that suppress spurious values in the currents of a differential output circuit.

RELATED ART

Advances in semiconductor manufacturing technology, as well as in computer and communication systems architectures, have resulted in demand for electronic systems with higher operating speeds, and higher frequency signals. Smaller feature sizes for circuit elements, such as transistors, as well as smaller interconnect pitches, generally produce faster digital circuits. Such reductions in the feature sizes have also resulted in the demand for higher levels of circuit integration, including the fabrication of Systems on Chip (SoC).

It is often desirable to form integrated circuits that exhibit a high degree of integration, including not just large sections of digital circuits, but also including the integration of analog functionality. While the aforementioned advances have done much for the rapid advancement of digital systems, those advances do not necessarily translate into equally impressive gains in the performance of analog circuits.

Analog waveforms produced by electronic circuits, for example those generated by a digital-to-analog converter (DAC), often exhibit spurious features, such as transients or ringing.

What is needed are methods and apparatus for reducing, or eliminating, spurious features in analog waveforms.

SUMMARY OF THE INVENTION

Briefly, methods and apparatus provide for front-end processing of a first differential output, whereby a first differential output current is received and a second differential output current having reduced spurious content is produced. Circuitry is used to divide, and reassemble, the first differential output current so as to provide an output signal with reduced spurious content. Such circuitry may be implemented as a return-to-zero circuit that is coupled to the terminals of a first differential current output stage. During a first phase, the return-to-zero circuit provides a differential output current equal to the first differential output current. During a second phase, the return-to-zero circuit provides a differential output current equal to zero. The return-to-zero circuit may be implemented with MOSFETs, or any other suitable electrical circuit element that provides the ability to controllably pass or refrain from passing current.

In one aspect of the present invention, a circuit is configured such that, in operation, it divides a first current of a differential output stage into at least two portions, divides a second current of a differential output stage into at least two portions, and reassembles those portions to produce at least a first and a second differential output signal in accordance with a predetermined schedule.

In a further aspect of the present invention, the first and second portions of the first current are assembled into the first differential output signal, and the first and second portions of the second current are assembled into the second differential output signal during a first clock phase, and the first portion of the first current and the second portion of the second current are assembled into the first differential output signal, and the second portion of the first current and the first portion of the second current are assembled into the second differential signal during a second clock phase.

Various means and methods have been described for reducing or eliminating spurious values in a differential output signal.

In one illustrative example, a circuit for producing a differential output signal having a true component and a false component, may include a means for receiving a first differential current signal, the first differential current signal having a first component and a second component; and a means for converting the first component and the second component into the true component and the false component of the differential output signal, wherein the true component and the false component of the differential output signal are substantially equal to each other during a zero phase, and the true component and the false component are substantially equal to the first component and the second component of the first differential signal, respectively, during tracking phase. Such a circuit may also include a means for generating a plurality of bootstrapped clock signals, the means for generating the plurality of bootstrapped clock signals being coupled to the means for converting the first component and the second component into the true component and the false component of the differential output signal.

In another illustrative example, a circuit for producing a differential current output, the differential current including a first signal and a second signal, includes a means for setting the output current of the first signal and the second signal to be substantially equal to the currents of respective first and second input currents during a tracking phase, and a means for setting the output current of the first signal and the second signal to be substantially equal to each other during a zero phase.

Various embodiments of the present invention may have one or more of the following advantages.

Prior art implementations have used track-and-attenuate methods, whereby the differential output currents are effectively shorted to ground using a FET during the zero phase and released during the track phase. As compared to the "track-attenuate" method, mentioned above, embodiments of the present invention have the advantage of setting the RZT and RZF output currents to the middle of their range during the zero phase, rather than to ground. Thus, on average, the RZT and RZF output currents will have less "current distance" to travel on any particular phase transition (i.e., whether zero-to-tracking or tracking-to-zero), and will therefore adjust more quickly. The quicker adjustment times mean fewer and briefer transient anomalies, which in turn enables faster clock speeds.

Compared to the conventional "track-attenuate" approach, embodiments of the present invention have the advantage of setting the differential output current of the RZ circuit to zero during the zero phase, instead of just attenuating the differential input. This has the effect of substantially reducing, or completely eliminating, spurious output during the zero phase.

BRIEF DESCRIPTION OF THE DRAWINGS

FIG. 2 is a schematic diagram of a MOSFET based implementation of a current steering circuit in accordance with the present invention.

FIGS. 3A to 3D show circuits for generating the control signals for FIG. 2.

DETAILED DESCRIPTION

Figure 1:
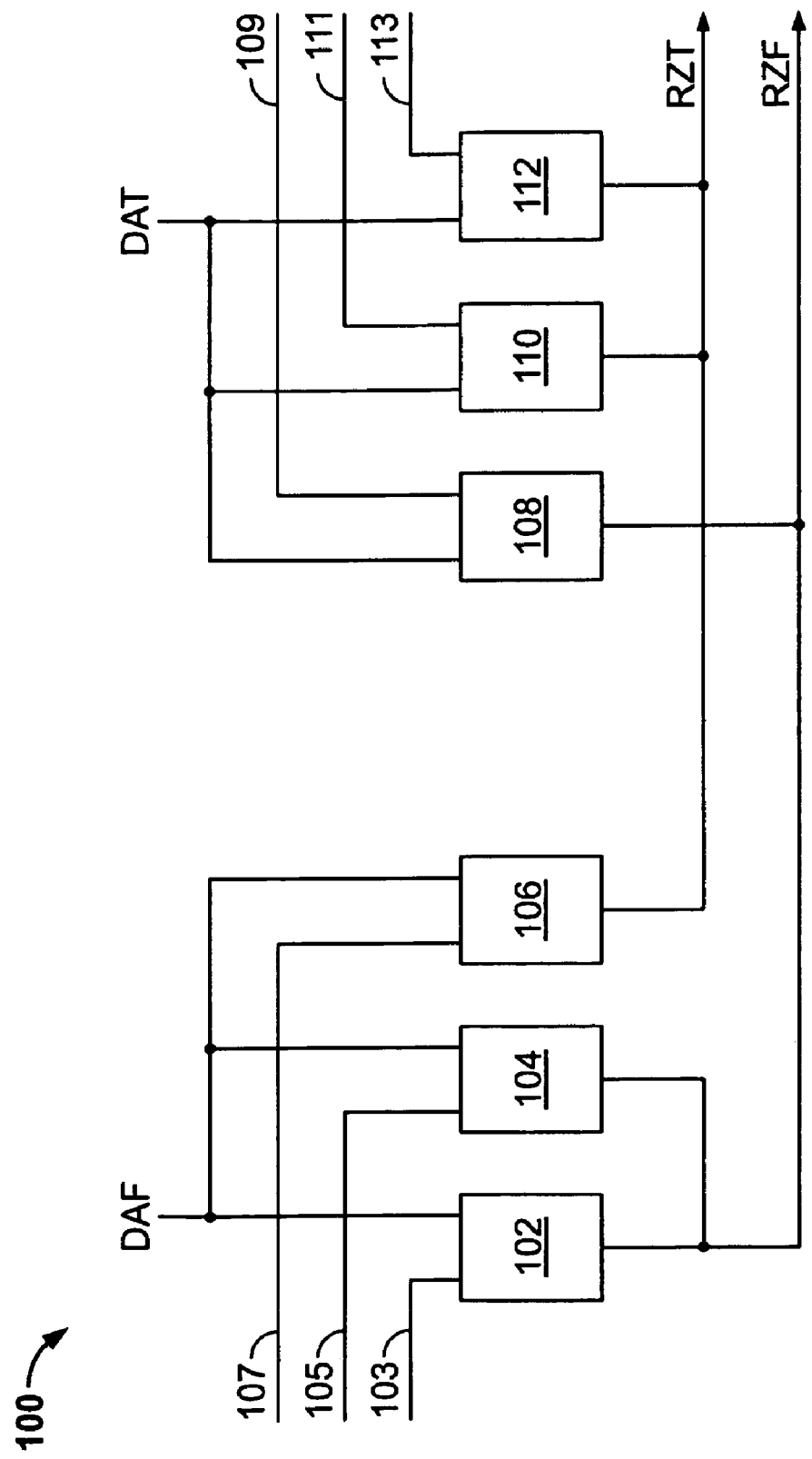
FIG. 1 is a block diagram of a current steering circuit in accordance with the present invention.

Analog waveforms produced by electronic circuits, for example those generated by a digital-to-analog converter (DAC), often exhibit spurious features, such as transients or ringing. Various embodiments of the present invention provide methods and apparatus for producing cleaner analog waveforms that more truly reflect their ideal values.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

The terms, chip, integrated circuit, monolithic device, semiconductor device, and microelectronic device, are often used interchangeably in this field. The present invention is applicable to all the above as they are generally understood in the field.

FET, as used herein, refers to field effect transistors including metal-oxide-semiconductor field effect transistors (MOSFETs). These transistors are also known as insulated gate field effect transistors (IGFETs).

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

Source/drain terminals refer to those terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals. Designers often designate a particular source/drain terminal to be a "source" or a "drain" on the basis of the voltage to be applied to that terminal when the FET is operated in a circuit. S/D refers to the source and/or drain junctions that form two of the terminals of a FET.

Terminal refers to a connection point. Typically, outputs, or output terminals, are coupled to inputs, or input terminals, to propagate signals.

To form a single large transistor it is often necessary to connect several smaller transistors in parallel. When a large transistor is formed in this way, the smaller individual transistors are sometimes referred to as legs.

FIGS. 1 and 2 illustrate embodiments of the present invention. FIG. 1 is a more generalized block diagram, and FIG. 2 is a more specific illustration of an embodiment of the present invention implemented with field effect transistors.

Referring to FIG. 1, a circuit 100 in accordance with the present invention is described. Circuit 100 includes switchable current paths 102, 104, 106, 108, 110, and 112. As illustrated in FIG. 1, switchable current paths 102, 104, 106, 108, 110, and 112, each include a current input terminal, a current output terminal, and a control terminal. Switchable current paths 102, 104, 106, 108, 110, and 112 may be any circuit element or elements that can pass a current from an input terminal to an output terminal under control of at least one signal applied to a control input terminal. Similarly, the switchable conductive paths can block the flow of current when so directed by the control signals applied to their respective control signal input terminals. It is noted that the switchable current paths need not be ideal devices. In other words, the present invention contemplates that some implementations may be fabricated with electrical circuit elements that have leakage paths or other non-ideal characteristics. Such non-ideal characteristics, may affect the amount, or nature, of the improvements in electrical performance offered by the circuit topologies of the present invention, but are still within the scope of the present invention. Switchable current paths include, but are not limited to, field effect transistors (FETs), bipolar transistors, vacuum tubes, field emission devices, and the like.

In the illustrated embodiment of FIG. 1, switchable current paths 102, 104, 106, 108, 110, and 112, are chosen so as to have the same impedance characteristics. It is noted that as a practical matter, the switchable current paths may have substantially the same, if not identically the same impedance characteristics. By substantially the same, it is meant that the nominally targeted values are achieved within the manufacturing tolerances of any particular fabrication process. Again, it is noted that when circuit 100 is fabricated, the switchable current paths will not necessarily be ideal devices, and therefore the impedance characteristics of each switchable current path may vary slightly, typically due to variances in manufacturing tolerances, even though their impedance characteristics are nominally the same. By targeting the impedance characteristics of each of the switchable current paths to be the same, an even, or substantially even, division of a current between two switchable current paths is achieved. Variation of impedance characteristics between switchable current paths may affect the amount, or nature, of the improvements in electrical performance offered by the circuit topologies of the present invention, but are still within the scope of the present invention.

As shown in FIG. 1, the current input terminals of switchable current paths 102, 104, and 106 are each coupled to a current source DAF. The current input terminals of switchable current paths 108, 110, and 112 are each coupled to a current source DAT. DAT and DAF are the current output terminals of a circuit that is operable to produce a differential output current. The current output terminals of switchable current paths 102, 104, and 108 are coupled to a first node, which is labelled RZF. The current output terminals of switchable current paths 106, 110, and 112 are coupled to a second node, which is labelled RZT. RZT and RZF are the current output terminals of circuit 100.

Still referring to FIG. 1, switchable current paths 102, 104, 106, 108, 110, and 112, are respectively coupled to receive control signals from nodes 103, 105, 107, 109, 111, and 113. In operation, the control signals available at nodes 103, 105, 107, 109, 111, and 113 determine whether their associated switchable current paths will conduct current, or block the flow of current.

In an illustrative example of the operation of circuit 100, control signals at nodes 103 and 113 are set such that switchable current paths 102 and 112 are always "on", that is, in a current conducting state. In a first time period, or clock phase, control signals at nodes 105, 111, 107, and 109, are set such that switchable current paths 104 and 110 are turned on, and switchable current paths 106 and 108 are turned off. In this way the current from DAF is passed through switchable current paths 102, 104 onto node RZF; and the current from DAT is passed through switchable current paths 112 and 110 onto node RZT. In a second time period, or clock phase, control signals at nodes 105, 111, 107, and 109, are set such that switchable current paths 104 and 110 are turned off, and switchable current paths 106 and 108 are turned on. In this way half the current from DAF is passed through switchable current path 102 onto node RZF, and half the current from DAF is passed through switchable current path 106 onto node RZT; and half the current from DAT is passed through switchable current path 112 onto node RZT, and half the current from DAT is passed through switchable current path 108 onto node RZF. In this manner, both the DAT and DAF outputs have ½ (DAT+DAF) on their outputs, thus the difference between RZT and RZF is zero (the 'zero' state of the return-to-zero topology in accordance with the present invention).

Referring now to FIG. 2, a return-to-zero (RZ) circuit in accordance with the present invention is illustrated. More particularly, a circuit including n-channel FETs, M1, M2, M3, M4, M5, and M6 is shown. M1 is coupled drain-to-source between a node DAF and a node RZF, and its gate terminal is coupled to a node Vdd. M2 is coupled drain-to-source between node DAF and node RZF, and its gate terminal is coupled to a node M2IN. M3 is coupled drain-to-source between node DAF and a node RZT, and its gate terminal is coupled to a node M3IN. M4 is coupled drain-to-source between node DAT and node RZF, and its gate terminal is coupled to a node M4IN. M5 is coupled drain-to-source between node DAT and node RZT, and its gate terminal is coupled to a node M5IN. M6 is coupled drain-to-source between node DAT and node RZT, and its gate terminal is coupled to node Vdd. It is noted that node Vdd, provides a voltage sufficient to put both M1 and M6 into a conducting, or "on" state. In this illustrative embodiment, FETs M1–M6 are sized to have the same transistor width and length dimensions. This sizing provides, within manufacturing limits, the same impedance characteristics.

It is further noted that, in the illustrative embodiment of FIG. 2, each of FETs M1–M6 may be referred to as a "logical" transistor, because each may be actually comprised of a plurality of transistors. In this particular implementation, each of logical FETs M1–M6 is formed, e.g., from 14 physical transistors coupled in parallel. This is typically done so that each logical FET will be able to sink large currents. However, the present invention is not limited to any particular physical layout or size of the FETs.

Referring to FIGS. 3A to 3D, "bootstrapping" circuits BST_M2, BST_M3, BST_M4, and BST_M5 are shown respectively. Circuit BST_M2 is coupled to node RZF and a node CT, and produces a control signal for FET M2 on node M2IN. BST_M3 is coupled to node RZT and a node CF, and produces a control signal for FET M3 on node M3IN. BST_M4 is coupled to node RZF and node CF, and produces a control signal for FET M4 on node M4IN.  BST_M5 is coupled to node RZT and node CT, and produces a control signal for FET M5 on node M5IN.

Non-overlapping clock signals which are generated conventionally are applied to nodes CT and CF in operation. The circuits for generating these non-overlapping clock signals may provide any suitable amount of current drive, rise and fall times, degree of non-overlap, or a clock cross-over voltage designed to reduce the non-overlap time without turning on any FETs during a designated "off" phase. Suitable non-overlapping clock generators are well known in the field of integrated circuit design and are not described in greater detail.

In a typical application, the RZ circuit of FIG. 2, functions as an output stage for an upstream circuit, i.e., a previous circuit stage (not shown). For example, the prior circuit might be a current-steering digital-to-analog converter (DAC).

Nodes DAT, DAF (Data True, Data False) deliver the differential output current of the prior circuit (i.e., the previous circuit stage). Nodes CT, CF (Clock True, Clock False) deliver high and low clock phases, respectively, to the RZ circuit.

Let $I_T$=the current supplied by input port DAT, and $I_F$=the current supplied by input port DAF, then the differential output current of the previous stage is $I_T$–$I_F$. This quantity is also, by definition, the differential input current of the illustrative RZ circuit.

RZT, RZF are the RZ circuit's differential output nodes, which carry the RZ-conditioned version of the differential output current from the previous circuit stage.

Circuits BST-M2, BST-M3, BST-M4 and BST-M5 "bootstrap" the outputs of transistors M2, M3, M4 and M5, respectively, by capacitively coupling the output signal of each FET back to its respective gate terminal. Bootstrapping causes these FETs to switch more quickly and completely upon clock transitions. Without bootstrapping, the output of the RZ circuit may exhibit inconsistent pulse widths, due to signal-dependent switching of FETs M2, M3, M4 and M5. Such inconsistent pulse widths may cause spurious signals to appear in the output waveform of the RZ circuit.

More particularly, bootstrapping works by boosting the voltage applied to a FET gate terminal by the output voltage of that FET. In effect, the input applied to the FET gate terminal "rides on top of" the output, thus removing signal dependency from the output waveform during track-to-zero mode transitions.

The function of circuits BST-M2, BST-M3, BST-M4, BST-M5 is to deliver cleaner, truer versions of signals CT, CF, CF, CT (respectively) to the gate terminals of FETs M2, M3, M4, M5 (respectively). Thus, bootstrapping serves to make actual circuit operation more nearly ideal. Accordingly, the following logical description of RZ circuit operation ignores the bootstrapping, because the bootstrapping is a performance-enhancing feature which does not affect the logical function of the circuit and is not required.

The illustrative RZ circuit of FIG. 2 works by dividing the currents $I_T$ and $I_F$ in half, then re-assembling those half currents depending upon clock phase. As shown in FIG. 2, the output current of node RZT is the sum of the currents through transistors M3, M5 and M6; and, the output current of node RZF is the sum of the currents through transistors M1, M2 and M4.

FETs M1, M2 and M3 act on the current $I_F$. M1, since its gate terminal is tied to $V_{dd}$, and is therefore always "on", always passes ½ $I_F$, regardless of clock phase. M2, since its gate terminal is driven by bootstrapped CT, passes ½ $I_F$ when the clock signal is true and no current when the clock signal is false. M3, since its gate terminal is driven by bootstrapped CF, passes no current during the "clock true" phase, and ½ $I_F$ during the "clock false" phase. FETs M6, M5 and M4, respectively, act in a symmetric manner on the current $I_T$.

Thus, during the clock true phase: node RZT passes a total current of $I_T$ (½ $I_T$ from M6 plus ½ $I_T$ from M5); node RZF passes a total current of $I_F$ (½ $I_F$ from M1 plus ½ $I_F$ from M2); and the RZ circuit's differential output current is $I_T$–$I_F$. During the clock false phase: node RZT passes a total current of ½ $I_T$+½ $I_F$ (½ $I_T$ from M6 plus ½ $I_F$ from M3); node RZF passes a total current of ½ $I_T$+½ $I_F$ (½ $I_F$ from M1 plus ½ $I_T$ from M4); and the RZ circuit's differential output current is zero. The above results are summarized in Table 1:

TABLE 1

|    | M1 | M2 | M3 | M4 | M5 | M6 | RZT | RZF | Output |
|----|----|----|----|----|----|----|-----|-----|--------|
| CT | ½ $I_F$ | ½ $I_F$ | 0 | 0 | ½ $I_T$ | ½ $I_T$ | $I_T$ | $I_F$ | $I_T$ – $I_F$ |
| CF | ½ $I_F$ | 0 | ½ $I_F$ | ½ $I_T$ | 0 | ½ $I_T$ | ½ $I_T$ + ½ $I_F$ | ½ $I_T$ + ½ $I_F$ | 0 |

Table 1 shows the current through each FET of the return-to-zero circuit, and the differential output current, for each clock phase. $I_T$ is the current supplied by the input port DAT, and $I_F$ is the current supplied by the input port DAF. As the table shows, the differential output current of the return-to-zero circuit is the differential input current of the return-to-zero circuit when clock is true, and zero when clock is false.

The arrival of a new input value in a high-speed electronic circuit can cause transient spikes and "ringing" in the input waveform. These features can cause spurious values to appear in the circuit's differential output current. The RZ circuit's clock goes low (i.e., CT presents false and CF presents true) coincident with the arrival of a new input value, via DAT and DAF. Also signal anomalies in the input waveform (such as transient spikes and "ringing") are substantially dissipated within half of a clock period. Thus, during the first half of each clock period (which may be referred to as the zero phase), when a new input value has just arrived and transient anomalies may occur, the RZ circuit's differential output current is zero. Also, during the second half of each clock period (which may be referred to as the tracking phase), when the input waveform has settled, the RZ circuit's differential output current is the differential output current of the prior circuit stage, or $I_T$–$I_F$.

The core logic, described above and summarized in Table 1, can be implemented as a highly efficient, six-transistor, current-divide-and-steer mechanism. It is noted that, although illustrated with MOSFETs, current-divide-and-steer circuit arrangements in accordance with the present invention may be implemented with any suitable circuit elements such as, but not limited to, bipolar transistors. It is further noted that current-steer-and-divide circuit arrangements in accordance with the present invention may be implemented with any suitable circuit element which is operable to provide a switchable current path.

Some embodiments of the present invention employ the technique of bootstrapping. Bootstrapping is known in the field of analog circuits, but is used in a novel way as incorporated in embodiments of the present invention. Transistors M2, M3, M4 and M5 are bootstrapped by their respective outputs, and therefore these devices switch more quickly and completely upon clock transitions, than they would without bootstrapping. This in turn delivers truer, more consistent pulse widths in the output of the illustrative RZ circuit, which reduces spurious signals in the output waveform and thereby improves spur-free dynamic range (SFDR).

It is to be understood that the present invention is not limited to the embodiments described above, but encompasses any and all embodiments within the scope of the appended claims.

What is claimed is:

1. A method for reduction of spurious values in a differential output circuit, comprising the acts of:
   setting the circuit's individual output currents to their corresponding input values during the circuit's operational phase;
   setting the circuit's individual output currents to about the middle of their common operating range during the circuit's zero phase;
   eliminating the circuit's aggregate output current; and
   bootstrapping internal signals of the circuit, each signal being bootstrapped by its respective output value.

2. A method for producing differential output signals comprising the acts of:
   receiving a first current and a second current;
   dividing the first current into a first portion and a second portion, and dividing the second current into a third portion and a fourth portion; and
   combining, during a first clock phase, the first portion and the second portion to form a first output current signal, and the third portion and the fourth portion to form a second output current signal.

3. The method of claim 2, wherein the first portion and the second portion are substantially equal currents.

4. The method of claim 3, wherein the third portion and the fourth portion are substantially equal currents.

5. The method of claim 4, wherein the first output current and the second output current form a differential pair of output currents.

6. The method of claim 2, further comprising the act of combining, during a second clock phase, the first portion and the third portion to form a third output current signal, and the second portion and the fourth portion to form a fourth output current signal.

7. The method of claim 2, wherein dividing the first current comprises providing a first pair of current pathways having substantially equal impedance.

8. The method of claim 7, wherein dividing the second current comprises providing a second pair of current pathways having substantially equal impedance.

9. The method of claim 8, wherein the first and second pathways each comprise a pair of field effect transistors, and further comprising the act of generating at least two control signals and providing a first one of the at least two control signals to a first field effect transistor of the first pathway, and providing a second one of the at least two control signals to a second field effect transistor of the second pathway.

10. A method of forming a differential current output signal, comprising the acts of:

during a first clock phase, dividing a first current into a first portion and a second portion by providing a first pair of current pathways of substantially equal impedance, and dividing a second current into a third portion and a fourth portion by providing a second pair of current pathways of substantially equal impedance; and combining the first and second portions to form a first output current, and the third and fourth portions to form a second output current.

11. The method of claim 10, further comprising the acts of:

during a second clock phase, dividing the first current into the first portion and a fifth portion by providing a third pair of current pathways of substantially equal impedance, dividing the second current into the third portion and a sixth portion by providing a fourth pair of current pathways of substantially equal impedance; and combining the first and sixth portions to form a third output current, and the third and fifth portions to form a fourth output current.

12. A circuit comprising:

first, second, and third switchable current paths, each having a first input terminal coupled to a first current source, each having a control input terminal respectively coupled to a first, second, and third control signal source, and each having an output terminal; and fourth, fifth, and sixth switchable current paths, each having a first input terminal coupled to a second current source, each having a control input terminal respectively coupled to a fourth, fifth, and sixth control signal source, and each having an output terminal;

wherein the output terminals of the first, second, and fourth switchable current paths are each coupled to a first node, and the output terminals of the third, fifth, and sixth switchable current paths are each coupled to a second node.

13. The circuit of claim 12, wherein the first, second, third, fourth, fifth, and sixth switchable current paths have substantially equal impedance.

14. The circuit of claim 12, wherein the first, second, third, fourth, fifth, and sixth switchable current paths each comprise at least one field effect transistor.

15. The circuit of claim 12, wherein the first switchable current path comprises a circuit element selected from the group consisting of field effect transistors, bipolar transistors, vacuum tubes, relays, and field emission devices.

16. The circuit of claim 12, wherein the first control signal source is a power supply node.

17. The circuit of claim 16, wherein the sixth control signal source is the power supply node.

18. The circuit of claim 12, wherein the first, second, third, fourth, fifth and sixth switchable current paths each comprise an n-channel FET having substantially equal impedance.

19. The circuit of claim 18, further comprising a first circuit having an output terminal coupled to the control input terminal of the second switchable current path; and a second circuit having an output terminal coupled to the control terminal of the third switchable current path.

20. The circuit of claim 19, further comprising a clock generator, operable to produce, at a first clock terminal, a first clock signal, and, at a second clock terminal, a second, non-overlapping, clock signal, wherein the first clock terminal is coupled to the first circuit and the second clock terminal is coupled to the second circuit.

21. A circuit for reduction of spurious values in a differential output signal, comprising:

a first FET coupled drain-to-source between a first current source and a first output port, and having a gate terminal coupled to a first node;

a second FET coupled drain-to-source between the first current source and the first output port, and having a gate terminal coupled to an output terminal of a first control signal source;

a third FET coupled drain-to-source between the first current source and a second output port and having a gate terminal coupled to an output terminal of a second control signal source;

a fourth FET coupled drain-to source between the second current source and the first output port, and having a gate terminal coupled to an output terminal of a third control signal source;

a fifth FET coupled drain-to-source between the second current source and the second output port, and having a gate terminal coupled to an output terminal of a fourth control signal source; and a sixth FET coupled drain-to-source between the second current source and second output port, having a gate terminal coupled to a second node;

wherein each of the first, second, third, fourth, fifth, and sixth FETS have substantially equal impedance.

22. The circuit of claim 21, wherein the first, second, third, fourth, fifth, and sixth FETs are n-channel FETs.

23. The circuit of claim 21, wherein the first node and the second node are the same.

24. The circuit of claim 21, wherein the first and fourth control signal sources are adapted to provide a first clock signal, and the second and third control signal sources are adapted to provide a second clock signal.

25. The circuit of claim 21, wherein the first control signal source is a first circuit including a first input terminal coupled to the first output port, and a second input terminal coupled to a first clock signal source.

26. The circuit of claim 25, wherein the second control signal source is a second circuit including a first input terminal coupled to the second output port, and a second input terminal coupled to a second clock signal source.

27. The circuit of claim 25, wherein the third control signal source is a third circuit including a first input terminal coupled to the first output port, and a second input terminal coupled to a second clock signal source.

28. The circuit of claim 25, wherein the fourth control signal source is a fourth circuit including a first input terminal coupled to the second output port, and a second input terminal coupled to a first clock signal source.

29. The circuit of claim 25, wherein the first clock signal source and the second clock signal source are operable to produce non-overlapping clock signals.

* * * * *